United States Patent
Lopez

(10) Patent No.: US 7,504,733 B2
(45) Date of Patent: Mar. 17, 2009

(54) SEMICONDUCTOR DIE PACKAGE

(75) Inventor: Osvaldo Jorge Lopez, Annandale, NJ (US)

(73) Assignee: Ciclon Semiconductor Device Corp., Bethlehem, PA (US)

( * ) Notice: Subject to any disclaimer, the term of this patent is extended or adjusted under 35 U.S.C. 154(b) by 524 days.

(21) Appl. No.: 11/205,687

(22) Filed: Aug. 17, 2005

(65) Prior Publication Data
US 2007/0040254 A1    Feb. 22, 2007

(51) Int. Cl.
H01L 23/48    (2006.01)
H01L 23/495    (2006.01)

(52) U.S. Cl. .................. 257/778; 257/787; 257/666; 257/E23.039

(58) Field of Classification Search ............. 257/778, 257/787, 666, E23.39, E23.039
See application file for complete search history.

(56) References Cited

U.S. PATENT DOCUMENTS

| | | | |
|---|---|---|---|
| 5,625,226 A | 4/1997 | Kinzer | |
| 5,977,630 A | 11/1999 | Woodworth et al. | |
| 6,040,626 A | 3/2000 | Cheah et al. | |
| 6,075,286 A | 6/2000 | Ewer | |
| 6,242,800 B1 | 6/2001 | Munos et al. | |
| 6,262,489 B1 | 7/2001 | Koors et al. | |
| 6,337,510 B1 * | 1/2002 | Chun-Jen et al. | 257/666 |
| 6,396,127 B1 | 5/2002 | Munoz et al. | |
| 6,404,050 B2 | 6/2002 | Davis et al. | |
| 6,482,680 B1 | 11/2002 | Khor et al. | |
| 6,489,678 B1 | 12/2002 | Joshi | |
| D471,165 S | 3/2003 | Williams et al. | |
| D472,528 S | 4/2003 | Kasem et al. | |
| 6,586,824 B1 | 7/2003 | Glenn et al. | |
| 6,593,622 B2 | 7/2003 | Kinzer et al. | |
| 6,611,047 B2 | 8/2003 | Hu et al. | |
| 6,617,655 B1 | 9/2003 | Estacio et al. | |
| 6,627,976 B1 | 9/2003 | Chung et al. | |
| 6,630,726 B1 | 10/2003 | Crowley et al. | |
| 6,638,790 B2 | 10/2003 | Minamio et al. | |
| 6,639,308 B1 | 10/2003 | Crowley et al. | |

(Continued)

OTHER PUBLICATIONS

Bai, et al., "Comparative Thermal and Thermomechanical Analyses of Solder-Bump and Direct-Solder Bonded Power Device Packages Having Double-Sided Cooling Capability," IEEE, 2004.

(Continued)

Primary Examiner—Nitin Parekh
(74) Attorney, Agent, or Firm—Duane Morris LLP

(57) ABSTRACT

A clip-less packaged semiconductor device includes at least one semiconductor die having bottom and top surfaces each having at least one electrode. A leadframe comprising a sheet of conductive material having top and bottom surfaces, the top surface being substantially planar, the bottom surface having a recessed region having a thickness less than the thickness of the sheet of conductive material formed in the sheet and defining a plurality of planar lead contacts, is electrically coupled to the top surface of the die at its bottom surface in the recessed region. An encapsulating layer partially encloses the leadframe and die, wherein the encapsulating layer occupies portions of the recessed region not occupied by the die, wherein the bottom surface of the die and the plurality of leadframe contacts are exposed through the encapsulating layer at least at the bottom surface of the packaged semiconductor device.

22 Claims, 7 Drawing Sheets

U.S. PATENT DOCUMENTS

| | | |
|---|---|---|
| 6,645,791 B2 | 11/2003 | Noquil et al. |
| 6,646,329 B2 | 11/2003 | Estacio et al. |
| 6,653,740 B2 | 11/2003 | Kinzer et al. |
| 6,661,082 B1 | 12/2003 | Granada et al. |
| 6,677,663 B1 | 1/2004 | Ku et al. |
| 6,677,669 B2 | 1/2004 | Standing |
| 6,696,321 B2 | 2/2004 | Joshi |
| 6,696,747 B1 | 2/2004 | Lee et al. |
| 6,700,187 B2 | 3/2004 | Paek |
| 6,707,138 B2 | 3/2004 | Crowley et al. |
| 6,713,322 B2 | 3/2004 | Lee |
| 6,723,582 B2 | 4/2004 | Glenn et al. |
| 6,730,544 B1 | 5/2004 | Yang |
| 6,744,124 B1 | 6/2004 | Chang et al. |
| 6,753,605 B2 | 6/2004 | Joshi |
| 6,756,658 B1 | 6/2004 | Gillett et al. |
| 6,762,067 B1 | 7/2004 | Quinones et al. |
| 6,773,964 B2 | 8/2004 | Fan |
| 6,794,740 B1 * | 9/2004 | Edwards et al. ............. 257/673 |
| 6,818,973 B1 | 11/2004 | Foster |
| 6,838,309 B1 | 1/2005 | McCann |
| 6,841,414 B1 | 1/2005 | Hu et al. |
| 6,844,615 B1 | 1/2005 | Edwards et al. |
| 6,846,704 B2 | 1/2005 | Paek |
| 6,847,103 B1 | 1/2005 | Perez et al. |
| 6,853,060 B1 | 2/2005 | Seok et al. |
| 6,858,919 B2 | 2/2005 | Seo et al. |
| 6,873,041 B1 | 3/2005 | Crowley et al. |
| 6,891,256 B2 * | 5/2005 | Joshi et al. ................. 257/676 |
| 6,943,434 B2 * | 9/2005 | Tangpuz et al. ............. 257/666 |
| 7,166,496 B1 | 1/2007 | Lopez et al. |
| 2001/0030362 A1 | 10/2001 | Grant |
| 2001/0045627 A1 | 11/2001 | Connah et al. |
| 2001/0048116 A1 | 12/2001 | Standing et al. |
| 2001/0048154 A1 | 12/2001 | Cheah et al. |
| 2001/0052639 A1 | 12/2001 | Jeon et al. |
| 2002/0008319 A1 | 1/2002 | Davis et al. |
| 2002/0066950 A1 | 6/2002 | Joshi |
| 2002/0070441 A1 | 6/2002 | Cheah |
| 2002/0135079 A1 | 9/2002 | Shivkumar et al. |
| 2002/0163040 A1 | 11/2002 | Kinzer et al. |
| 2003/0011005 A1 | 1/2003 | Joshi |
| 2003/0016505 A1 | 1/2003 | Jauregui |
| 2003/0067071 A1 | 4/2003 | Cardwell |
| 2003/0075786 A1 | 4/2003 | Joshi et al. |
| 2003/0107126 A1 | 6/2003 | Joshi et al. |
| 2003/0122247 A1 | 7/2003 | Joshi et al. |
| 2004/0021233 A1 | 2/2004 | Kinzer et al. |
| 2004/0061221 A1 | 4/2004 | Schaffer |
| 2004/0159939 A1 | 8/2004 | Joshi et al. |
| 2004/0164386 A1 | 8/2004 | Joshi et al. |
| 2004/0201086 A1 | 10/2004 | Joshi et al. |
| 2005/0179143 A1 | 8/2005 | Moxham |
| 2008/0105957 A1 * | 5/2008 | Joshi et al. ................. 257/666 |

OTHER PUBLICATIONS

U.S. Patent and Trademark Office Action from U.S. Appl. No. 11/222,651 (now U.S. 7,166,496) dated Jun. 27, 2006.

* cited by examiner

SEMICONDUCTOR DIE PACKAGE

FIELD OF THE INVENTION

The present invention relates to packages for single or multiple semiconductor devices and in particular to packages that require very low electrical and/or thermal resistance, inductance and cost.

BACKGROUND OF THE INVENTION

It is conventional in the electronic industry to encapsulate one or more semiconductor devices in a semiconductor package. These plastic packages protect a chip from environmental hazards, handling hazards and provide a method of an apparatus for electrically and mechanically attaching the chip to an intended device. The driving considerations in the package design are typically limiting parasitic inductances and resistances, cost and improving heat transfer.

Various approaches to packaging semiconductor devices have been documented in the literature as well as commercialized. Some approaches use leadframes that are stamped into the desired lead configuration on which semiconductor devices are attached and wire bonded prior to encapsulation followed by post-encapsulation lead forming, i.e., lead bending and shaping to the desired configuration. This packaging technique requires custom trimming and forming machinery and tools. These trimming and forming steps and requisite machinery along with the solder or epoxy die attachment and wire bonding, ribbon bonding or clip bonding add to production time, complexity and cost.

A second approach, the so-called quad-flat-no-lead approach utilizes a die mounted on a leadframe on a first major surface and a clip that connects the opposite surface of the die to the leadframe. Wire bonds and ribbon bonds are also utilized in this approach to couple the die to certain I/O leads. While no post-encapsulation forming step is required to bend and shape the leads, the clip attachment, wire bonding or ribbon bonding and die attachment steps increase production complexity and cost. In addition, as a result of having to include additional interfaces between the semiconductor die and the external environment, a substantial amount of electrical resistance, thermal resistance and inductance is introduced into the completed assembly.

Numerous other packaging approaches have also been proposed, such as the use of can or cup-shaped leadframes. See U.S. Pat. No. 6,744,124 entitled "Semiconductor Die Package Including Cup-Shaped Leadframe" to Chang et al. There remains a need, however, for a packaging solution that reduces device architecture and process complexity and that can be easily implemented (scaled or modified) for different semiconductor die designs or multiple die assemblies (multichip modules) without significant changes or modifications to the packaging process and machinery, and also a need to do so with very low parasitic resistance, inductance and/or thermal resistance.

SUMMARY OF THE INVENTION

A clip-less packaged semiconductor device having top and bottom surfaces and side surfaces therebetween includes at least one semiconductor die having a bottom surface and a top surface, the bottom surface having at least one electrode and the top surface having at least one electrode. A leadframe comprising a sheet of conductive material having top and bottom surfaces, the top surface being substantially planar, the bottom surface having a recessed region having a thickness less than the thickness of the sheet of conductive material formed in the sheet and defining a plurality of planar lead contacts, is electrically coupled to the top surface of the die at its bottom surface in the recessed region. An encapsulating layer partially encloses the leadframe and die, wherein the encapsulating layer occupies portions of the recessed region not occupied by the die, wherein the bottom surface of the die and the plurality of leadframe contacts are exposed through the encapsulating layer at least at the bottom surface of the packaged semiconductor device.

From the foregoing, a packaged device is provided that can be manufactured in a low cost and very production friendly manner. The package itself lacks the complexity of prior art packages, providing a robust package and cost savings. Because the die is provided in a recessed area etched in a planar layer of conductive material, a very thin device is produced. Further, the leadframe is easily configured to accommodate any number of die sizes, quantity die, type of die and electrode configurations simply by etching a different recessed region patterned into a leadframe precursor. The process and package, therefore, are easily scalable to different I/O (input/output) and die configurations, providing consequent reductions in development costs and time as well as implementation times for new designs. Custom and expensive wire or clip bonding machinery as well as trimming and forming machinery are not needed.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
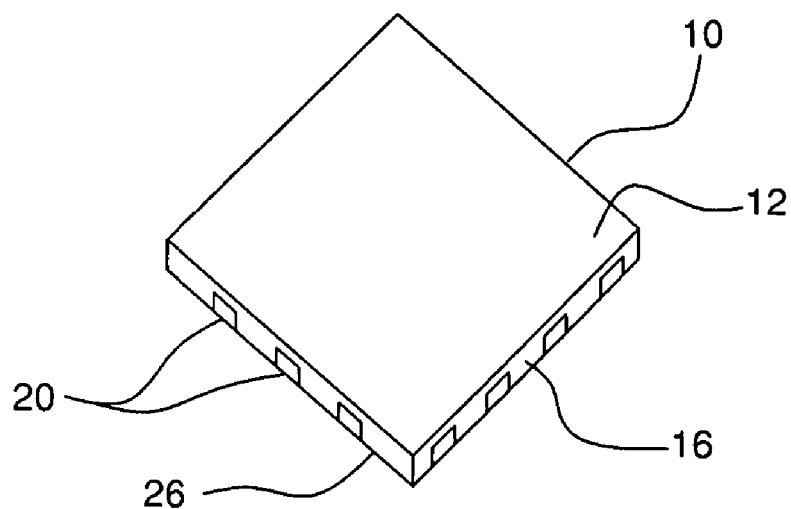
FIG. 1 is a top perspective view of a packaged semiconductor device according to the present invention.
Figure 2:
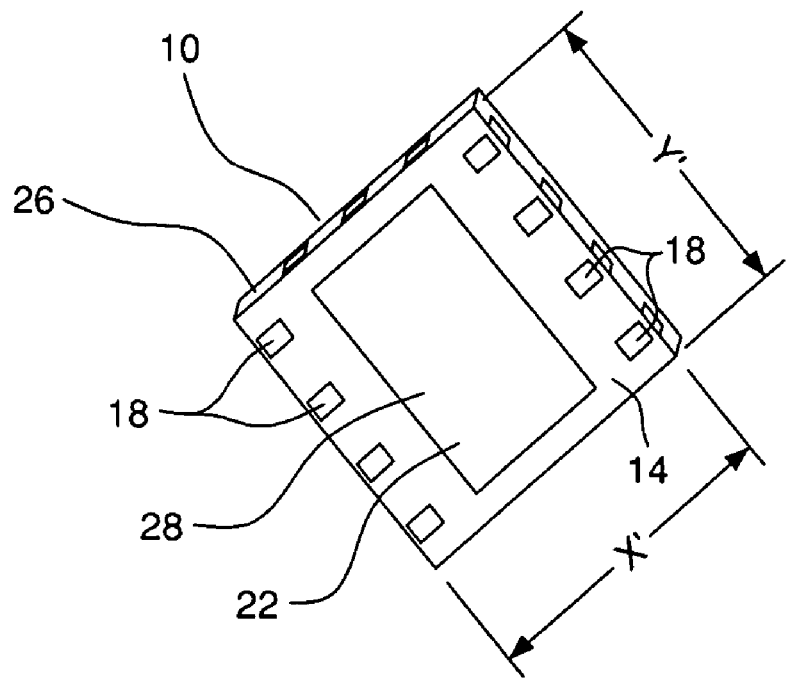
FIG. 2 is a bottom perspective view of the packaged semiconductor device of FIG. 1.

FIG. 1 is a top perspective view of a packaged semiconductor device 10, and FIG. 2 is a bottom perspective view of the device 10. Packaged device 10 has a planar top surface 12, a planar bottom surface 14 and side surfaces 16 generally orthogonal to the top and bottom surfaces 12, 14. As best seen in FIG. 2, the packaged device comprises a plurality of exposed lead contacts 18 which can comprise dummy lead contacts (i.e., contacts that are not internally electrically coupled to the semiconductor device) and any number of active lead contacts (i.e., contacts that are internally electrically coupled to the semiconductor device). Packaged device 10 includes a semiconductor die 22 having a bottom surface 28 having a bottom surface electrode exposed through encapsulating material or layer 26. In exemplary embodiments, the die 22 can be silicon, GaAs, SiC, GaN or other semiconductor material. In other exemplary embodiments, the die 22 can be a discrete transistor, diode, integrated circuit or other semiconductor device.

In one exemplary embodiment, the lead contacts 18 have bottom surfaces that are substantially planar and that are coplanar with the bottom surface 28 of the semiconductor die 22 and, therefore, with the bottom electrode of die 22. Optionally, the leads can also have a surface 20 that is exposed through encapsulating layer 26 along the side surfaces 16 of the packaged semiconductor device where the device was singulated from other devices during manufacturing.

Figure 3:
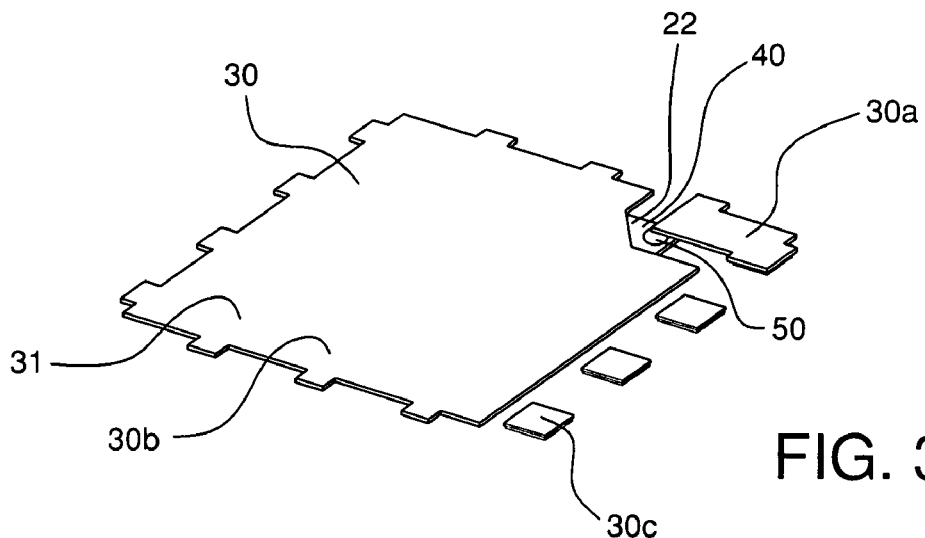
FIG. 3 is a top perspective view of an embodiment of a single site leadframe and semiconductor die assembly prior to encapsulation
Figure 4:
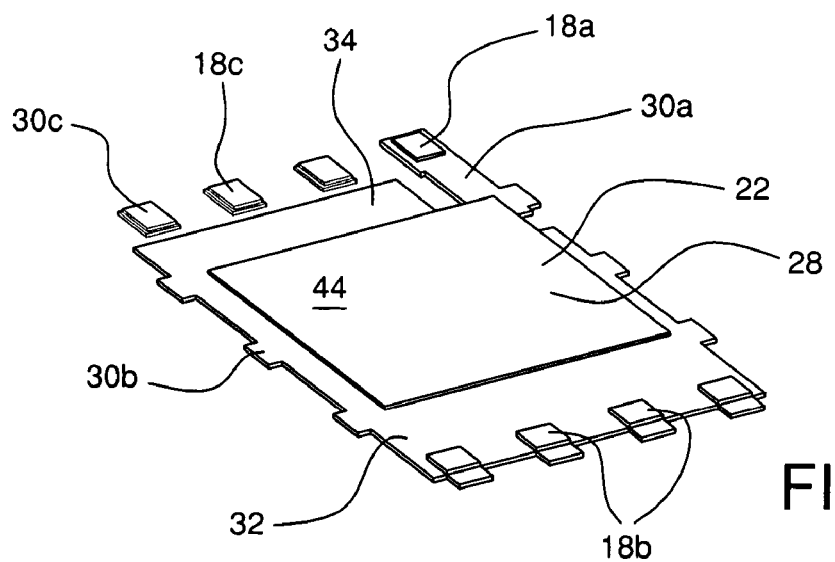
FIG. 4 is a bottom perspective view of the leadframe assembly of FIG. 3 prior to encapsulation.

Turning to FIG. 3, a top perspective view of a leadframe assembly is shown comprising leadframe 30 and die 22. FIG. 4 is a bottom perspective view showing the leadframe assembly. Leadframe 30 has a top surface 31 and a bottom surface 32, and die 22 has a top surface 29 (FIGS. 3 and 5) and a bottom surface 28. Only a portion of the top surface 29 of die 22 can be seen in FIG. 3, although it is fully shown in the top plan view of FIG. 5 discussed below.

In embodiments where the die has at least two electrodes on its top surface 29, the leadframe 30 has at least two sections 30a, 30b that are electrically isolated from each other and correspond to respective isolated electrodes from the top surface 29 of the die 22, which is described in more detail below. Sections 30c are dummy contacts in this embodiment.

Leadframe 30 is formed from a single sheet of conductive material, preferably copper (Cu) or a copper alloy, such as one containing small amounts or Fe, (e.g., CDA194 or the like), electroplated or otherwise coated with a layer of solderable (and preferably corrosion resistant or corrosion minimizing (collectively, "resistant")) conductive material such as tin, gold, tin lead, silver or other solderable material. The CDA 194 copper alloy provides excellent strength, electric conductivity and thermal conductivity, and is used widely as an international standard copper alloy. The CDA194 alloy contains 2.1 to 2.8% by mass Fe, 0.015 to 0.15% P, and 0.05 to 0.20% Zn. While the top surface 31 of the leadframe 30 is planar, the bottom surface 32 has a recessed region designated generally at 34. This recessed region 34 is preferably etched into the bottom surface 32 of the leadframe 30, as described in more detail below, to leave planar lead contacts 18 (shown as lead contacts 18a, 18b, 18c). In an exemplary embodiment, the exposed surface of the planar lead contacts 18 is preferably planar with the bottom surface 28 of the die 22 coupled to the leadframe 30. In that embodiment, recessed region 34 is recessed an amount substantially equal to the combined thickness of die 22 and any bonding interface layer that couples die 22 to leadframe 30 (e.g., solder bumps, balls or studs (collectively, "solder bumps"), conductive adhesive, epoxy or cement (collectively, "conductive adhesive")). In one exemplary embodiments, the bonding interface layer has a thickness between about 1-3 mils.

Figure 5:
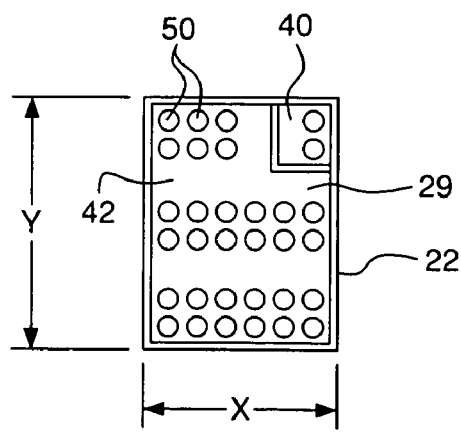
FIG. 5 is a top plan view of an embodiment of semiconductor die of FIGS. 3 and 4.

FIG. 5 is a top plan view of the die 22. In one exemplary embodiment, die 22 comprises a power MOSFET with vertical current flow. In the illustrated embodiment, the power MOSFET has a gate electrode 40, a drain electrode 42 (best seen in FIG. 5) and a source electrode 44 (best seen in FIG. 4).

The top surface 29 of die 22 has a plurality of solder bumps 50 formed thereon for electrically coupling the die 22 to the leadframe 30. Alternatively, or in addition thereto, a conductive adhesive (not shown), such as PbSn solder paste or conductive silver epoxy could be used.

When die 22 is coupled to leadframe 30, such as in a flip chip process, gate electrode 40 aligns with section 30a of the leadframe 30, making planar lead contact 18a a gate contact. Drain electrode 42 aligns with section 30b, making planar lead contacts 18b drain contacts. In this embodiment, planar tabs 18c of section 30c are not used.

The leadframe assembly, i.e., the combined leadframe 30 and die 22, are then encapsulated with encapsulating material 26 to form the packaged semiconductor device 10 shown in FIGS. 1 and 2. In an exemplary embodiment, the encapsulating material is a plastic thermosetting material, such as CELH9220 HF10 epoxy resin available from Hitachi Chemical, formed around the assembly by injection, transfer molding or other like methods.

Figure 6:
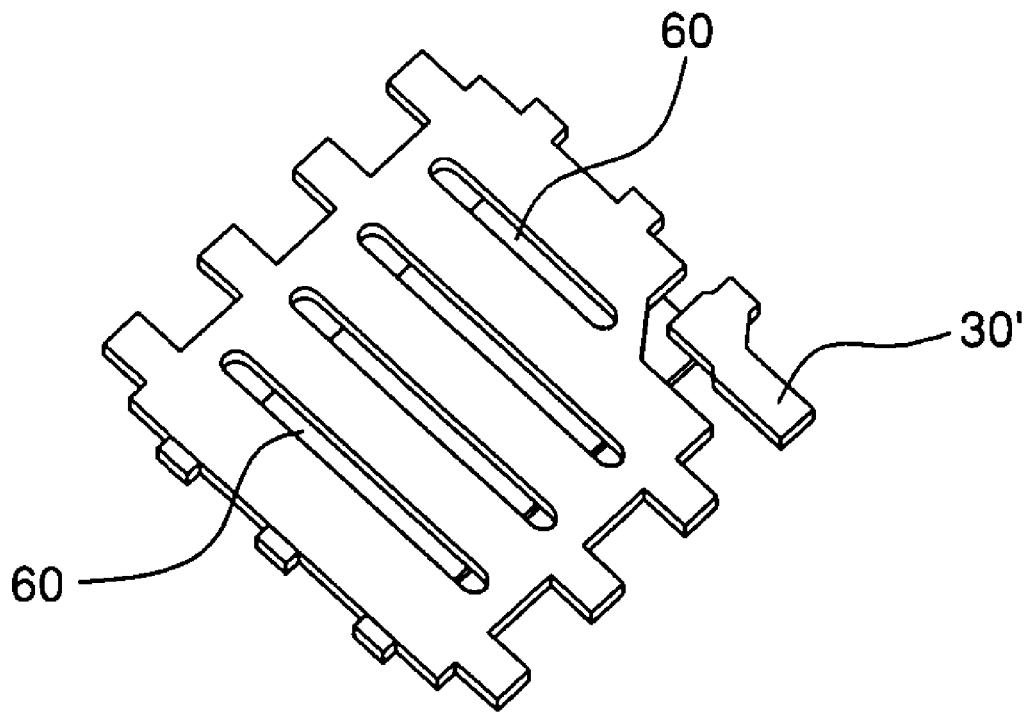
FIG. 6 is a top perspective view of an alternative leadframe and semiconductor die assembly.
Figure 7:
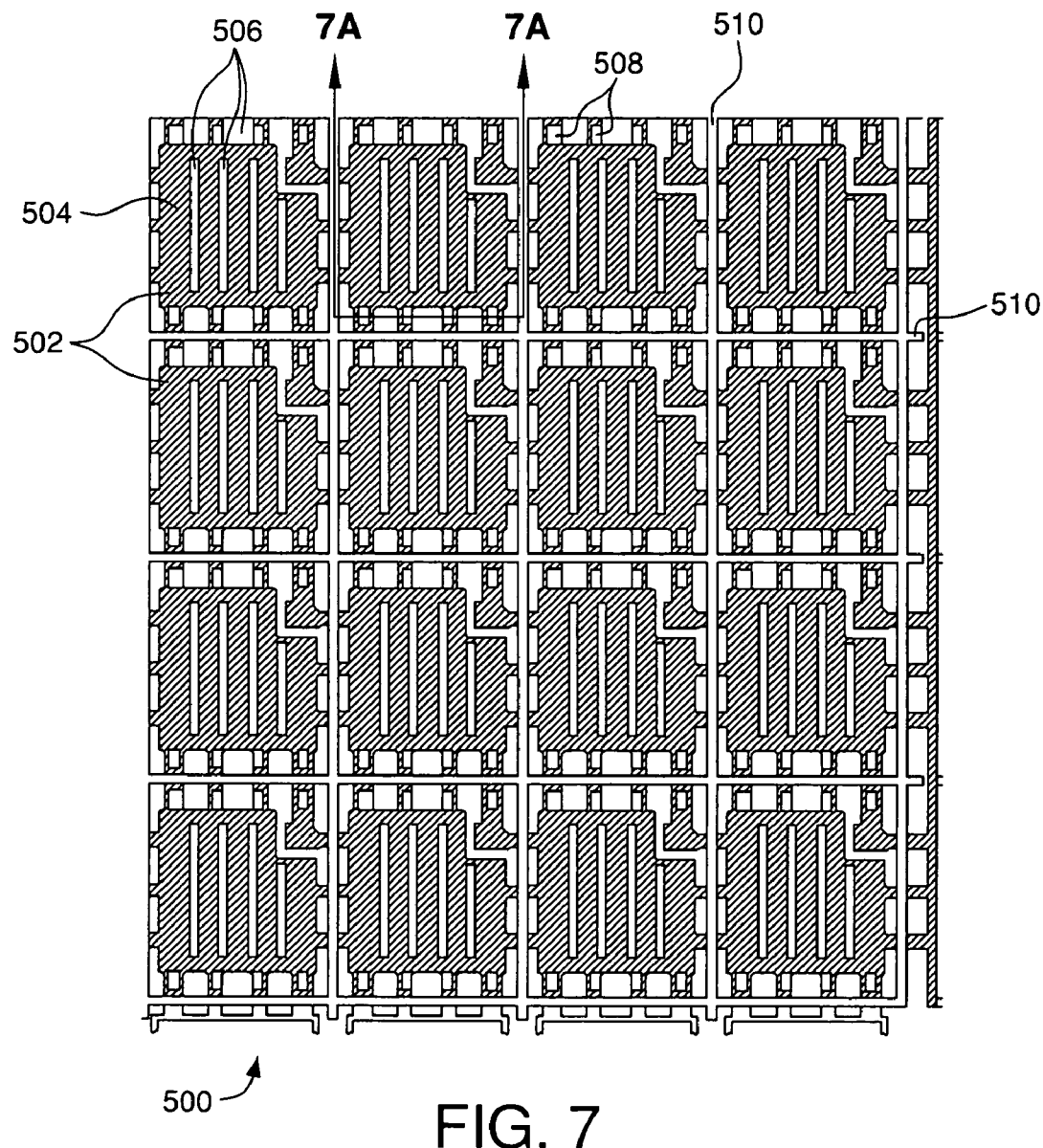
FIG. 7 is a bottom plan view of an embodiment of an array of interconnected leadframe precursor sites.
Figure 7A:
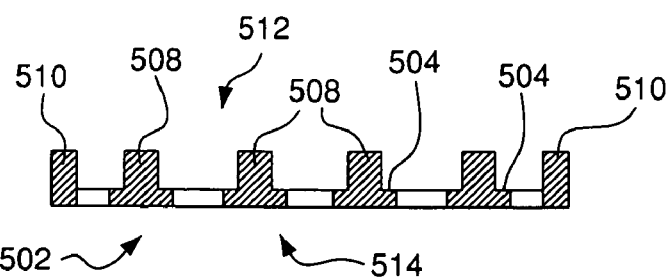
FIG. 7A is a cross section view of FIG. 7 taken along lines 7A-7A.

FIG. 6 is a top perspective view of an alternative embodiment of a leadframe/die assembly where leadframe 30' has openings (shown as slots 60 in this embodiment) formed completely therethrough. These slots 60 facilitate the flow of the encapsulating material 46 around the die 22 and leadframe 30', creating a more robust final packaged product. These slots in lead frame 30 can be circular, rectangular, square or as shown in FIG. 6, or comprise a number of spaced openings, collectively forming a slot An exemplary method of making packaged semiconductor products 10 is now described in connection with FIG. 7 and FIGS. 8A-8G. FIG. 7 is a bottom plan view of a portion of an array 500 including a plurality of identical, replicated and connected leadframe precursor sites 502. FIG. 7A is a cross-sectional view of an individual site 502 taken along lines 7A-7A of FIG. 7. Surface 512 is the bottom surface of array 500 and surface 514 is the top surface of array 500. The array 500 has been etched from a layer of conductive material with shaded or hatched areas 504 representing recessed regions etched into, and partially through, the initial layer of conductive material, leaving planar I/O contacts or tabs 508 and connection streets 510. Some areas 506 are etched or stamped completely through the initial layer of conductive material to more fully define the leadframe sites and to provide areas, such as described above in connection with FIG. 6, for allowing the encapsulating material to flow through the leadframe and encapsulate the affixed die. Singulation of the leadframe sites 502, as described below in more detail, occurs along streets 510.

FIGS. 8A-8G illustrate the formation of two packaged semiconductor devices, but it should be understood that the illustrated process applies to the formation of one or more semiconductor devices. Assuming precursor sites of about 5 mm×6 mm, an exemplary array of leadframe precursors sites has between about 60-70 leadframe sites, allowing for the formation of the same number of packaged semiconductor dies. Of course, the number of sites can be larger or smaller depending on the desired site size.

Figure 8A:
FIGS. 8A-8G is cross-sectional views illustrating an exemplary method of making a packaged semiconductor device.

In FIG. 8A, a pre-plated and configured array 100 is provided. As described above, the array 100 preferably comprises a layer of conductive material such as a copper alloy with or without a plated solderable finish. This array can be formed from etching, stamping or otherwise forming the array a sheet of conductive material.

Figure 8B:
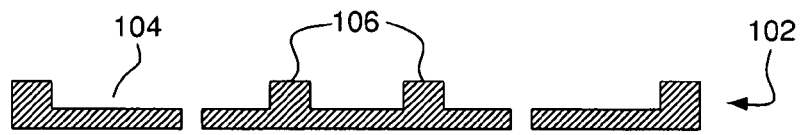

Next, as shown in FIG. 8B, a mask (not shown) is formed over the bottom surface of the array 100 and the array 100 is etched to form patterned array 102 having recessed region 104 and planar tabs 106. Formation of masks and processes for etching metallic materials into defined patterns are familiar to those in the art, for example wet etch processes.

Figure 8C:
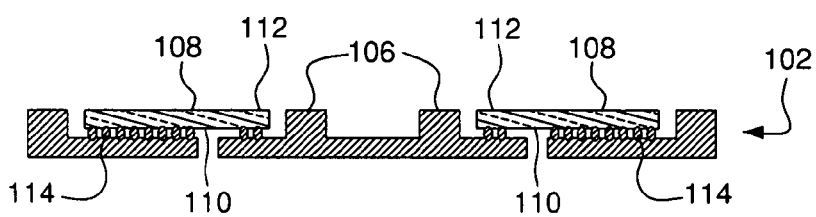

In FIG. 8C, a plurality of semiconductor dies 108 are provided. In one embodiment, each die has a plurality of electrodes (e.g., drain and gate electrodes) on its respective top surfaces 110 and at least one electrode (e.g., source electrode) on its respective bottom surfaces 112. The dies 108 are provided with solder bumps or stud bumps 114 for electrically connecting the electrodes of the top surfaces 110 to the corresponding regions of the leadframe 102. The dies are mounted using the well-know flip chip process. A conductive adhesive (not shown) may also be used in some embodiments.

Figure 8D:
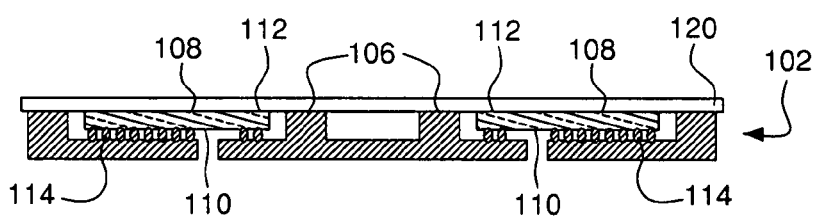

In FIG. 8D, a tape 120 or other means for covering the planar contacts 106 and bottom surface 112 of the die 108, is provided. The tape 120 protects these surfaces from being covered by the encapsulating material during the subsequent molding process. In one embodiment, tape 120 is a high temperature tape, such as tapes available from DuPont and distributed under the mark KAPTON.

Figure 8E:
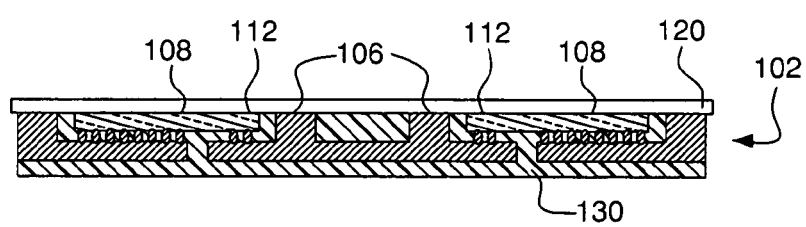

In FIG. 8E, the taped structure is provided to a transfer mold (not shown) for application and hardening (i.e., curing of the thermosetting resin, e.g., epoxy) of the encapsulation material 130. The encapsulation material 130 is applied to cover the leadframe 102 and dies 108, while the tape 120 protects the contact surfaces and bottom surfaces 112 of the dies 108.

Figure 8F:
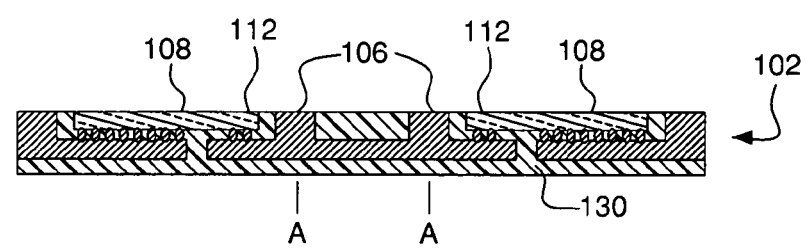

In FIG. 8F, the tape 120 is removed. The structure is deflashed to remove any flash plastic at the mold joints. Also, the exposed contact surfaces 106 and bottom surfaces 112 of dies 108 are optionally cleaned and coated at this stage with a solderable metal (not shown), such as tin, gold, or silver. Adhesive metals, such as nickel, can be used between the copper and gold layers.

Figure 8G:
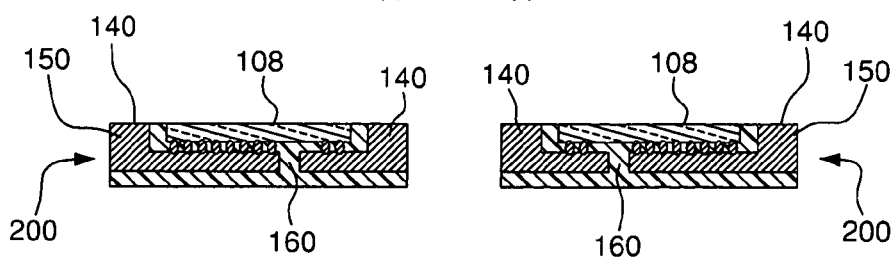

Next, in FIG. 8G, the encapsulated leadframe 102 is cut (e.g., sawed) at points A (FIG. 8F) to form a plurality of individual packaged semiconductor devices 200. The cut locations are selected to form individual planar contact regions 140 of each package 200. This process step is also known as singulation. Each device 200 includes a leadframe 150, encapsulation 160 and die 108. The device is then tested and or branded with device information.

Although the die can be any size, in one exemplary embodiment, the die 22 has dimensions X/Y between about 3.0×4.0 mm (12 mm$^2$) and 4.3×4.6 mm (approximately 20 mm$^2$). In this embodiment, the thickness of the die is preferably between about 2-8 mils but can also be either thinner than 2 mils or thicker than 8 mils. The packaged device 10 preferably has dimensions X'/Y' of about 5×6 mm (30 mm$^2$), although the package can be any size as dictated by the die and design. Using this manufacturing method, a similar size prior art package can be manufactured to hold larger die or integrated circuits, significantly increasing the die to package foot print ratio.

Figure 9:
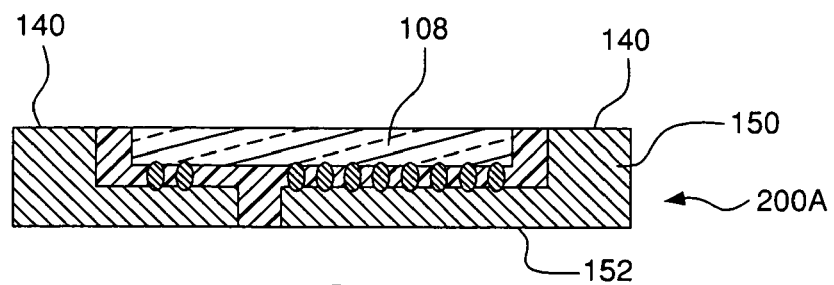
FIG. 9 is a cross-sectional view of an alternative embodiment of a packaged semiconductor device.

FIG. 9 shows a cross-sectional view of a low profile packaged semiconductor device 200A having no encapsulation material covering that top surface 152 of the leadframe 150. This device 200a can be fabricated by allowing the mold press to contact surface 152 during the molding application. This embodiment provides for improved vertical heat conduction or convection directly from the leadframe 150 to the external environment of the packaged device 200A during use.

From the foregoing, a packaging method is provided that is low cost and very production friendly. The package itself lacks the complexity of prior art packages, providing a robust package and cost savings. Because the die is provided in a recessed area etched in a planar layer of conductive material, a very thin device is produced. Further, the leadframe is easily configured to any number of die sizes and electrode configurations simply by etching a different recessed region patterned into a leadframe precursor. The process and package, therefore, are easily scalable to different I/O and die configurations, providing consequent reductions in development costs and time as well as implementation times for new designs. Custom and often expensive trimming and forming machinery and tools are not needed. Certain embodiments also require no wire bonding. Clips are not utilized, thereby reducing complexity, cost and thickness.

Figure 10A:
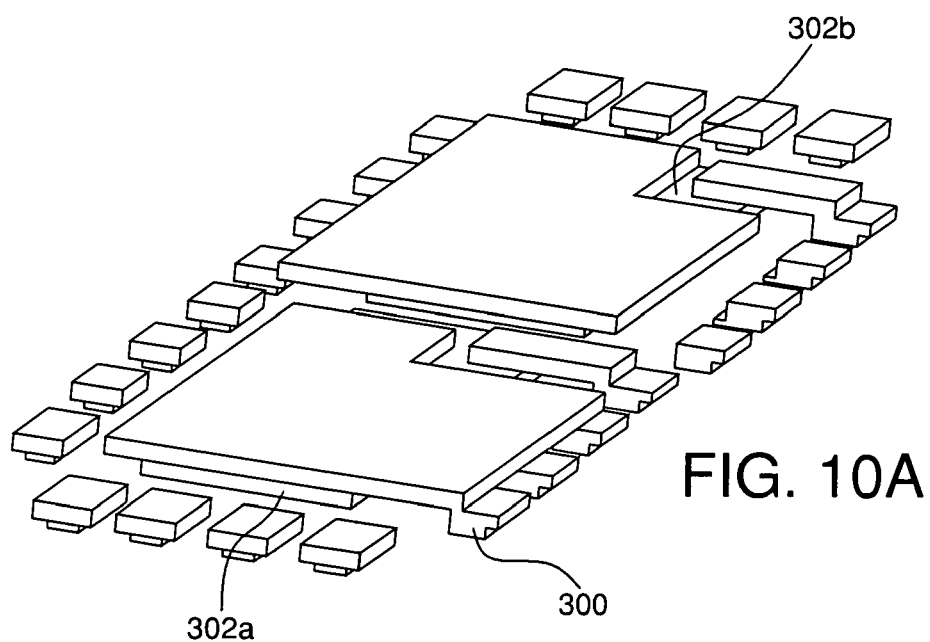
FIGS. 10A/10B and 11 illustrate embodiments having a plurality of packaged semiconductors therein.
Figure 10B:
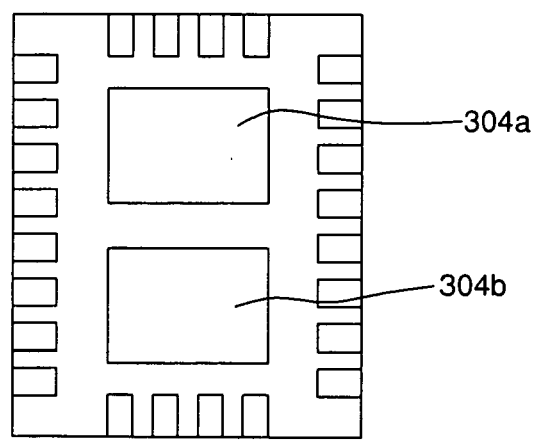
Figure 11:
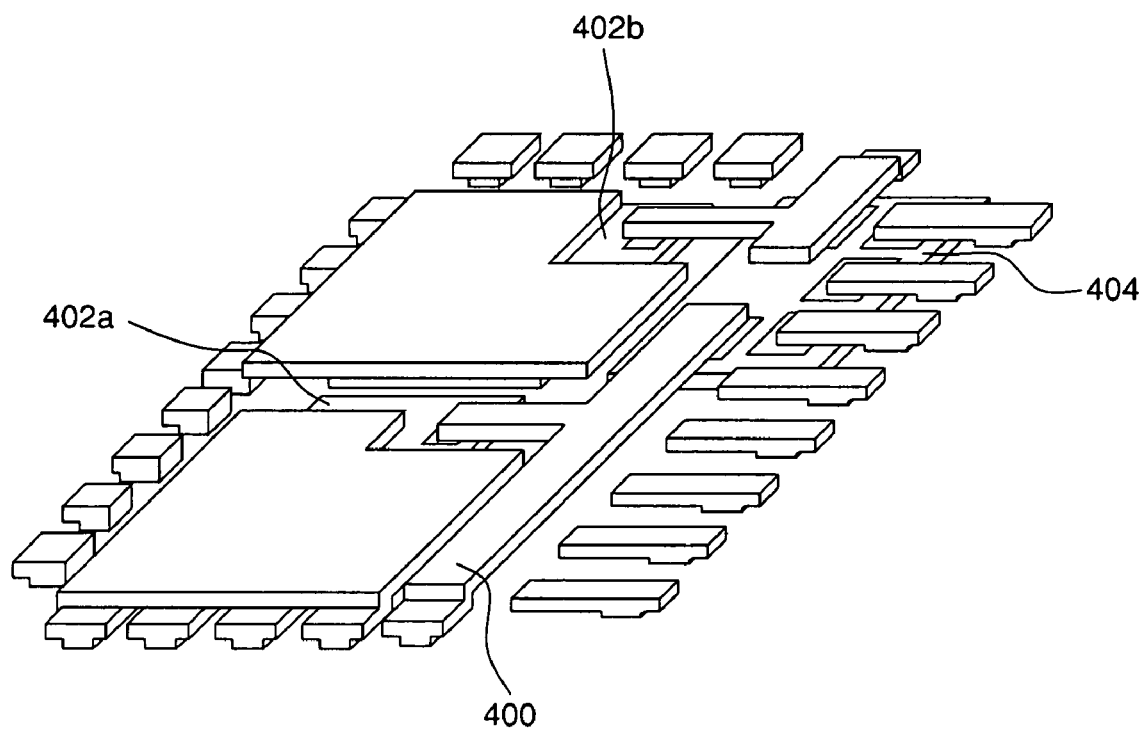

Still further, the process is easily adaptable to providing two or more dies per packaged device, as shown in FIGS. 10A, 10B and FIG. 11. In one embodiment, more than one power transistor device can be provided per packaged device. For example, FIG. 10A is a perspective view of a leadframe and multiple die assembly comprising leadframe 300 and MOSFET dies 302a, 302b. FIG. 10B is a bottom plan view showing the assembly of FIG. 10A encapsulated with bottom die electrodes 304a, 304b exposed. In an alternative embodiment, a power transistor and an integrated circuit die, such as a gate driver, can be encapsulated within the same package. FIG. 11 is a perspective view of a leadframe and multiple die assembly comprising a leadframe 400, two MOSFET dies 402a, 402b and a gate driver die 404. Because the necessary configuration is simply etched into a planar sheet of conductive material, such configurations merely require a new mask pattern for the corresponding design. All other aspects of the process remain the same as described above.

Although the packaged device has been described above principally in connection with a semiconductor die having a bottom exposed source electrode with isolated gate and drain electrodes on an opposite side thereof, the package and packaging method described above are also applicable to other die configurations, such as where the top surface of the die coupled to the lead frame is configured to have (i) FET source or drain only, (ii) FET drain and gate only, (iii) FET source and gate only, (iv) FET gate, drain and source, (v) BJT emitter or collector only, (v) BJT base and emitter only, (vi) BJT base and collector only, (vii) BJT base, collector and emitter, (viii) multiple I/O of an integrated circuit, or (ix) anode, cathode or both anode and cathode of a diode. The bottom exposed surface can be the (i) FET source only, (ii) FET drain only, (ii) FET gate and source, (iv) FET gate and drain, (v) BJT emitter only, (vi) BJT collector only, (vii) BJT base and emitter, (viii) BJT base and collector, (ix) multiple I/O of an integrated circuit, or finally (x) no electrode at all, i.e., just bare semiconductor substrate material or metallized semiconductor substrate material The design also provides for low parasitic I/O and interconnect inductances, and both low electrical and thermal resistances, based on performed calculations familiar to those in the art. The design is also multi-chip module (MCM) capable.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A clip-less packaged semiconductor device, said packaged semiconductor device having top and bottom surfaces and side surfaces therebetween, comprising:

at least one semiconductor die, said die having a bottom surface and a top surface, said bottom surface having at least one electrode, said top surface having at least one electrode;

a leadframe, said leadframe comprising a sheet of conductive material having top and bottom surfaces, said top surface being substantially planar, said bottom surface having a recessed region having a thickness less than the thickness of said sheet of conductive material formed in said sheet and defining a plurality of planar lead contacts;

wherein said die is electrically coupled to said leadframe with said top surface of said die electrically coupled to the bottom surface of said leadframe in said recessed region; and an encapsulating layer, said encapsulating layer partially enclosing said leadframe and die, wherein said encapsulating layer occupies portions of said recessed region not occupied by said die, wherein said bottom surface of said die and said plurality of planar lead contacts are exposed through said encapsulating layer, at said bottom surface of said packaged semiconductor device.

2. The device of claim 1, wherein said semiconductor die is coupled to said bottom surface of said leadframe with a bonding interface layer comprising a conductive adhesive and/or solder bumps, and wherein said recessed region is formed into said sheet of conductive material to a depth about equal to the combined thickness of said die and said bonding interface layer.

3. The device of claim 1, wherein said semiconductor die comprises a power MOSFET device, wherein said top surface of said die comprise a gate electrode and a drain electrode and wherein said bottom surface of said die comprises a source electrode.

4. The device of claim 1, wherein said top surface of said leadframe is exposed through said encapsulating layer.

5. The device of claim 1, wherein said recessed region is recessed to a depth such that said bottom surface of said die is substantially planar with said plurality of planar lead contacts.

6. The device of claim 1, further comprising at least a second semiconductor die coupled to said leadframe and at least partially encapsulated by said encapsulating layer.

7. The device of claim 1, wherein said semiconductor die comprises an integrated circuit or a diode.

8. A clip-less, bondwire-less and ribbon-less packaged semiconductor device, said packaged semiconductor device having top and bottom surfaces and side surfaces therebetween, comprising:

at least one semiconductor die, said die having a bottom surface and a top surface, said bottom surface having at least one electrode, said top surface having a plurality of electrodes;

a leadframe, said leadframe comprising a layer of conductive material having top and bottom surfaces, said top surface being substantially planar, said bottom surface having a recessed region formed in said layer defining a plurality of planar lead contacts, said leadframe having at least two electrically isolated sections corresponding to said plurality of electrodes of said top surface of said die, each section comprising at least one lead contact from said plurality of planar lead contacts;

wherein said die is electrically coupled to said leadframe with said top surface of said die coupled to the bottom surface of said leadframe in said recessed region with said plurality of electrodes coupled to respective isolated sections from said leadframe; and an encapsulating layer, said encapsulating layer partially enclosing said leadframe and die, wherein said encapsulating layer occupies portions of said recessed region not occupied by said die and is disposed between said isolated regions, wherein said bottom surface of said die and said plurality of planar lead contacts are exposed through said encapsulating layer at least said bottom surface of said packaged semiconductor device.

9. The device of claim 8, wherein said semiconductor die is coupled to said bottom surface of said leadframe with a bonding interface layer comprising a conductive adhesive and/or solder bumps.

10. The device of claim 9, wherein said recessed region is formed into said layer of conductive material to a depth about equal to the combined thickness of said die and said bonding interface layer.

11. The device of claim 8, wherein said semiconductor die comprises a power MOSFET device, wherein said plurality of electrodes at said top surface of said die comprise a gate electrode and a drain electrode and wherein said at least one electrode at said bottom surface of said die comprises a source electrode.

12. The device of claim 8, wherein said leadframe comprises openings therethrough between said top and bottom surface, wherein said encapsulating layer occupies said openings.

13. The device of claim 8, wherein said encapsulating layer covers said top surface of said leadframe.

14. The device of claim 8, wherein said top surface of said leadframe is exposed through said encapsulating layer.

15. The device of claim 8, wherein said layer of conductive material of said leadframe comprises a metal layer plated with a conductive layer.

16. The device of claim 8, wherein said semiconductor die comprises a bipolar power transistor.

17. The device of claim 8, wherein each of said planar lead contacts is formed on an extended interconnect patterned in said layer of conductive material, wherein a side surface of at least one of said interconnects is exposed through said encapsulating layer at a respective side surface of said package.

18. The device of claim 17, wherein at least one of said sections comprises a plurality of said extended interconnects.

19. The device of claim 8, wherein said recessed region is recessed to a depth such that said bottom surface of said die is substantially planar with said plurality of planar lead contacts.

20. The device of claim 8, further comprising a second semiconductor die coupled to said leadframe and at least partially encapsulated by said encapsulating layer.

21. A clip-less, bondwire-less and ribbon-less packaged semiconductor device, said packaged semiconductor device having top and bottom surfaces and side surfaces therebetween, comprising:

at least one semiconductor die, said die having a bottom surface and a top surface, said top surface having at least one electrode;

a leadframe, said leadframe comprising a sheet of conductive material having top and bottom surfaces, said top surface being substantially planar, said bottom surface having a recessed region having a thickness less than the thickness of said sheet of conductive material formed in said sheet and defining a plurality of planar lead contacts;

wherein said die is electrically coupled to said leadframe with said top surface of said die electrically coupled to the bottom surface of said leadframe in said recessed region; and an encapsulating layer, said encapsulating layer partially enclosing said leadframe and die, wherein said encapsulating layer occupies portions of said recessed region not occupied by said die, wherein said bottom surface of said die and said plurality of planar lead contacts are exposed through said encapsulating layer at said bottom surface of said packaged semiconductor device.

22. The device of claim 21, wherein said bottom surface of said die has no electrodes and said top surface of said die has a plurality of electrodes, said leadframe having at least two electrically isolated sections corresponding to said plurality of electrodes of said top surface of said die, each section comprising at least one lead contact from said plurality of planar lead contacts.

* * * * *